US006977502B1

(12) United States Patent
Hertz

(10) Patent No.: US 6,977,502 B1
(45) Date of Patent: Dec. 20, 2005

(54) CONFIGURABLE MATRIX RECEIVER FOR MRI

(75) Inventor: David Hertz, Dix Hills, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/700,388

(22) Filed: Nov. 4, 2003

Related U.S. Application Data

(60) Provisional application No. 60/423,596, filed on Nov. 4, 2002.

(51) Int. Cl.[7] .............................................. G01V 3/00
(52) U.S. Cl. ..................................... 324/318; 324/319
(58) Field of Search ............................... 324/318, 319, 324/314, 309, 307; 600/413

(56) References Cited

U.S. PATENT DOCUMENTS

| | | |
|---|---|---|
| 4,070,708 A | 1/1978 | Smallcombe et al. |
| 4,665,364 A | 5/1987 | Hanawa |
| 4,700,138 A | 10/1987 | Shimazaki et al. |
| 4,703,267 A | 10/1987 | Maudsley |
| 4,806,866 A | 2/1989 | Maier |
| 4,825,162 A | 4/1989 | Roemer et al. |
| 4,831,329 A | 5/1989 | Hughes |
| 4,871,966 A | 10/1989 | Smith et al. |
| 5,023,552 A | 6/1991 | Mehlkopf et al. |
| 5,093,621 A | 3/1992 | Den Boef et al. |
| 5,160,891 A * | 11/1992 | Keren ........................ 324/318 |
| 5,202,686 A | 4/1993 | Rapp et al. |
| 5,451,876 A | 9/1995 | Sandford et al. |
| 5,510,711 A | 4/1996 | Molyneaux et al. |
| 5,529,068 A * | 6/1996 | Hoenninger et al. ........ 600/413 |
| 5,621,321 A | 4/1997 | Liu et al. |
| 5,653,233 A | 8/1997 | Pelc et al. |
| 5,739,691 A | 4/1998 | Hoenninger, III |
| 5,742,163 A | 4/1998 | Liu et al. |
| 6,025,717 A | 2/2000 | Hertz et al. |
| 6,043,659 A | 3/2000 | McKinnon |
| 6,046,591 A | 4/2000 | King et al. |
| 6,289,232 B1 | 9/2001 | Jakob et al. |

(Continued)

FOREIGN PATENT DOCUMENTS

EP          0380174          8/1990

(Continued)

OTHER PUBLICATIONS

Robert W. Dykstra, "An NMR Preamplifier Modification Provides Increased Proton Sensitivity", Journal of Magnetic Resonance, vol. 78, pp. 574-576, 1988.

*Primary Examiner*—Brij B. Shrivastav
(74) *Attorney, Agent, or Firm*—Brandon N. Sklar; Kaye Scholer, LLP

(57) ABSTRACT

A configurable matrix receiver comprises a plurality of antennas that detect one or more signals. The antennas are coupled to a configurable matrix comprising a plurality of amplifiers, one or more switches that selectively couple the amplifiers in series fashion, and one or more analog-to-digital converters (ADCs) that convert the output signals generated by the amplifiers to digital form. For example, in one embodiment, a matrix comprises a first amplifier having a first input and a first output, and a second amplifier having a second input and a second output, a switch to couple the first output of the first amplifier to a the second input of the second amplifier, a first ADC coupled to the first output of the first amplifier, and a second ADC coupled to the second output of the second amplifier. In one embodiment, the signals detected by the antennas include magnetic resonance (MR) signals.

40 Claims, 11 Drawing Sheets

U.S. PATENT DOCUMENTS

| | | |
|---|---|---|
| 6,333,707 B1 | 12/2001 | Oberhammer et al. |
| 6,424,153 B1 | 7/2002 | Liu et al. |
| 6,448,770 B1 | 9/2002 | Liu et al. |
| 6,549,799 B2 * | 4/2003 | Bock et al. .................. 600/422 |
| 6,621,433 B1 | 9/2003 | Hertz |
| 6,636,038 B1 * | 10/2003 | Heid ........................... 324/314 |
| 6,683,494 B2 * | 1/2004 | Stanley ........................ 330/10 |

FOREIGN PATENT DOCUMENTS

| | | |
|---|---|---|
| EP | 0431684 A1 | 6/1991 |
| JP | 62073146 | 4/1987 |
| JP | 01221153 | 9/1989 |
| JP | 02305549 | 12/1990 |
| JP | 04079937 | 3/1992 |
| JP | 6078899 | 3/1994 |

\* cited by examiner

CONFIGURABLE MATRIX RECEIVER FOR MRI

The present application claims priority to Provisional Patent Application No. 60/423,596, filed on Nov. 4, 2002, which is assigned to the assignee of the present invention and incorporated by reference herein.

FIELD OF THE INVENTION

The present invention is directed to an apparatus and method for detecting and analyzing signals characterized by wide dynamic range, and particularly to such apparatus and methods where the signals are provided by a plurality of antennas that are low in cost and require minimal calibration.

BACKGROUND OF THE INVENTION

In a Magnetic Resonance Imaging (MRI) system, a receiving coil detects magnetic resonance properties of a sample of material under study (e.g., a patient's body). The receiving coil outputs a resonance signal that varies greatly in amplitude in very short bursts. To obtain this signal, the sample has to be subjected to various cycles of magnetic fields and a burst of radio energy, after which, the receiving coil receives a burst of return radio energy. This is repeated many times for each image, each time using a slightly different magnetic field, called the phase-encoding gradient. The phase-encoding gradient makes each physical part of the sample radiate a slightly different signal so that a computer can determine the correspondence between a portion of the signal and the physical part of the sample.

The receiving coil typically detects one or more nuclear magnetic resonance (NMR) signals generated by a volume of the sample material. The dimensions of the sample volume may vary depending on system requirements and on the needs of the system operator. For example, to generate a two-dimensional (2D) MRI image, a slice having a width of about five (5) millimeters may be sufficient. On the other hand, if a three-dimensional (3D) image is desired, it may be necessary to scan a substantially larger volume, referred to as a slab volume, such as a slab volume fifty (50) millimeters wide, for example.

Each of the signal bursts of return radio energy corresponds to a unique cycle corresponding to a different phase encoding gradient. These signals are converted to digital form using an analog-to-digital converter (ADC), and stored in a matrix, with the corresponding phase encoding varying by row, and time (from beginning to the end of the signal) varying by column. Then mathematics is performed on the rows and columns to transform the rows and columns of signal data to rows and columns of an image, like the pixels of a computer monitor, as is known in the art.

The amplitude for each signal corresponding to a given phase encoding level can vary over a very wide range. However, that range normally varies from one phase encoding level to the next; the range tends to swell and then taper off as the phase-encoding level is varied. The signal range also varies with slice thickness, pulse repetition time, echo time, sample material size, sample material fat content, the type of receiver coil, etc., but these remain constant during a given imaging sequence.

In an MRI system, the need to process signals having widely varying ranges poses particular challenges. One such difficulty is related to the problem of quantization noise. Quantization noise is a type of noise that results from error in the conversion of an analog signal to a digital form by an ADC. Digital signals have discrete steps in amplitude, while analog signals can be smooth. So while an analog signal may rise or fall like a ramp, a digital signal rises or falls in discrete steps, like a staircase. When a smooth analog signal is transformed into a signal with steps, a certain amount of error results because portions of the analog signal between the steps must be converted to a signal that skips from one step to another rather than smoothly varying between them. This makes a smooth analog signal look like a noisy analog signal. To eliminate this type of additional noise, designers try to use ADCs with a lot of steps; the more steps, the finer the graininess caused by jumping between steps. However, there are practical reasons for using the ADC with the smallest number of steps possible. One is that using more steps can make the downstream equipment that uses the digital signal very expensive because each signal level must be encoded by a large amount of data.

The design of signal conditioning systems involving the conversion of analog signals to digital form invariably confronts the issue of quantization noise, although in most cases, it is just a routine step in the design process. But in some kinds of signal analysis systems, including MRI systems, quantization noise is not so easily addressed. This is because of a characteristic of certain signals known as "dynamic range," which refers to how much variation the signal exhibits in its amplitude. A signal with a large dynamic range contains useful data at portions that are high in amplitude and at portions that are low in amplitude. In MRI systems, this problem is acute because useful information is contained in the signal all the way down to the point at which its amplitude approaches zero.

The problem with handling such signals arises because of the large number of ADC steps required when a signal varies greatly in amplitude. Ideally, the designer wants as many steps as possible to minimize the quantization noise. However, the amount of noise in the original analog signal places a lower limit on how much a greater number of steps will ultimately increase the quality of the digital signal. It makes no sense to add more steps to the ADC when the steps of the ADC are already much smaller than noise in the original analog signal. Trying to reduce the magnitude of a very small quantization noise added to a signal that already has a much higher noise level, is wasteful because it takes a lot of computing power to handle a digital signal with a lot of amplitude steps. Therefore, the best approach is to select an ADC whose step size (least significant bit) is smaller than the amplitude of the noise part of the original analog signal.

One common problem frequently encountered in the field of MRI imaging is related to the fact that the performance of many receivers is optimal only for signals having an amplitude within a specified range. For example, a receiver that is configured and calibrated to process a signal or a set of signals having a specified dynamic range may fail to produce useful results when used to measure a signal with, say, a much greater dynamic range. Accordingly, in MRI systems, it is important to ensure that a receiver used to detect and process a resonance signal having a respective amplitude is configured and calibrated to be able to handle a signal of such amplitude. The maximum signal amplitude relative to the noise that a particular receiver experiences is referred to as the receiver's "dynamic range requirement."

The dynamic range requirement of an MRI receiver is proportional to the NMR signal, which is itself proportional to the size of the imaging volume (or to the sample volume within the imaging volume). This is due to the fact that at a certain point in time, all the excited nuclei within the imaging volume (or in the sample volume within the imaging volume) are in phase and generate a signal that is the sum of all the nuclei. For example, as is discussed above, generating a 3D image generally requires a larger imaging volume or sampling volume than is needed for 2D imaging. Consequently, the dynamic range requirement tends to be higher when a receiver is used to perform 3D imaging.

One practice common in the MRI field is the use of multiple coils to detect a resonance signal from a volume under study. In one well-known implementation, an array consisting of multiple coils allows a physician to perform a full-body scan of a patient. When the volume is divided into sub-volumes with a plurality of coils, the dynamic range requirement of the receiver is reduced. If the receiver comprises multiple coils each of which is coupled to a channel in the receiver, increasing the number of coils can reduce the dynamic range requirement for each channel.

Some existing MRI systems use coil arrays comprising coils that are decoupled from each other. Such coil arrays include phased array coils and quadrature coils, for example. Coils of an array may be decoupled due to their geometry (angle and/or distance between coils) and other methods, as is known in the art. Coil arrays may be used to cover a large imaging volume, dividing the large imaging volume into smaller sub-volumes. Some or all of the sub-volumes may overlap. Small coils usually have a higher Q and higher filling factor than larger coils, enabling a substantial improvement in image quality, especially over a large imaging volume. In addition, the smaller coils in the array may be coupled to pre-amplifiers and receivers that are better able to accommodate the required dynamic range of the signals detected by the receiving coil.

The use of multiple coil arrays in an MRI system enables the operator some ability to control the dynamic range requirement for each coil in the array. However, it is still typically the case for each receiver in a coil array system to be configured and calibrated for signals having a specified dynamic range. Therefore, the use of coil arrays in existing MRI systems reduces, but does not eliminate, the dynamic range requirement problem.

SUMMARY OF THE INVENTION

U.S. Pat. No. 6,621,433 ("the 433 Patent"), entitled Adaptive Dynamic Range Receiver for MRI, issued on Sep. 16, 2003, by the inventor of the present application, describes a receiver for analog to digital conversion of signals having broad dynamic range, such as magnetic resonance ("MR") signals. The '433 patent is assigned to the assignee of the present invention and is incorporated by reference herein. In accordance with the present invention, certain of the receiver systems of the '433 patent are adapted to be readily reconfigured for connection to a plurality of coils in an array. The receiver chains disclosed in the '433 patent may be divided into smaller chains having multiple gains and analog-to-digital converters for each coil.

Accordingly, the present invention provides a signal processing system capable of processing one or more signals characterized by wide dynamic range from a plurality of antennas. In one embodiment, a signal processing system comprises a one or more antennas for detecting a signal. Each antenna is coupled to a configurable matrix comprising a plurality of amplifiers for applying various gains to the signal, one or more switches for connecting the amplifiers in series fashion, and one or more analog-to-digital converters (ADCs) for converting the output signals generated by the amplifiers to digital form. For example, in one embodiment, the matrix comprises a first amplifier having a first output and a second amplifier having a second output, a switch switching the first output of the first amplifier to an input of the second amplifier, a first ADC coupled to the first output and a second ADC coupled to the second output. In one embodiment, the signal detected by the antenna is a magnetic resonance (MR) signal. In another embodiment, the one or more antennas comprise a coil array.

In another embodiment of the invention, a signal processing system comprises a one or more antennas for detecting a signal, and a configurable matrix receiver. The configurable matrix receiver comprises a plurality of amplifiers for applying various gains to the signal, one or more switches for connecting the amplifiers in series fashion, one or more analog-to-digital converters (ADCs) for converting the output signals generated by the amplifiers to digital form, and a digital signal processor (DSP). The DSP receives a digital signal from each of said ADCs, selecting one of the digital signals having a lowest distortion, and corrects for lack of phase coherence and differing gain in the digital signals, whereby said one of said digital signals remains normalized with respect to others of said digital signals when said others are selected.

DETAILED DESCRIPTION OF THE EMBODIMENTS

The present application provides a selectively configurable matrix receiver that can be optimized for different coil arrays. The receiver coil is split into multiple coils that are sensitive to only part of the imaging volume. Each coil is coupled to a different pre-amplifier, amplifier and digitizing channel. The individual coils of the array may be optimized for the particular imaging sub-volume. In one embodiment, the configurable matrix receiver described herein may be utilized, e.g., in an MRI system to perform full body scans.

In one embodiment, signals are received from an imaging volume by a plurality of receiving coils, e.g., an array. Each coil is coupled to a matrix that includes a plurality of amplifiers and a plurality of digitizers. Because multiple coils are used, each coil is associated with a sub-volume smaller than the entire imaging volume. Since the dynamic range requirement of a coil decreases in proportion to a decrease in the size of the imaging volume, as mentioned above, fewer amplifiers/digitizers are required for each chain. Alternatively, different numbers of chains of amplifiers/digitizers may be assigned to each coil, based on the characteristics of the coil.

U.S. Pat. No. 6,621,433 ("the '433 Patent"), entitled Adaptive Dynamic Range Receiver for MRI, issued on Sep. 16, 2003, by the inventor of the present application, describes a receiver for analog to digital conversion of signals having broad dynamic range, such as magnetic resonance ("MR") signals. The '433 patent is assigned to the assignee of the present invention and is incorporated by reference herein. In accordance with the present invention, certain of the receiver systems of the '433 patent are adapted to be readily reconfigured for connection to a plurality of coils in an array. The receiver chains disclosed in the '433 patent may be divided into smaller chains having multiple gains and analog-to-digital converters for each coil.

Figure 1:
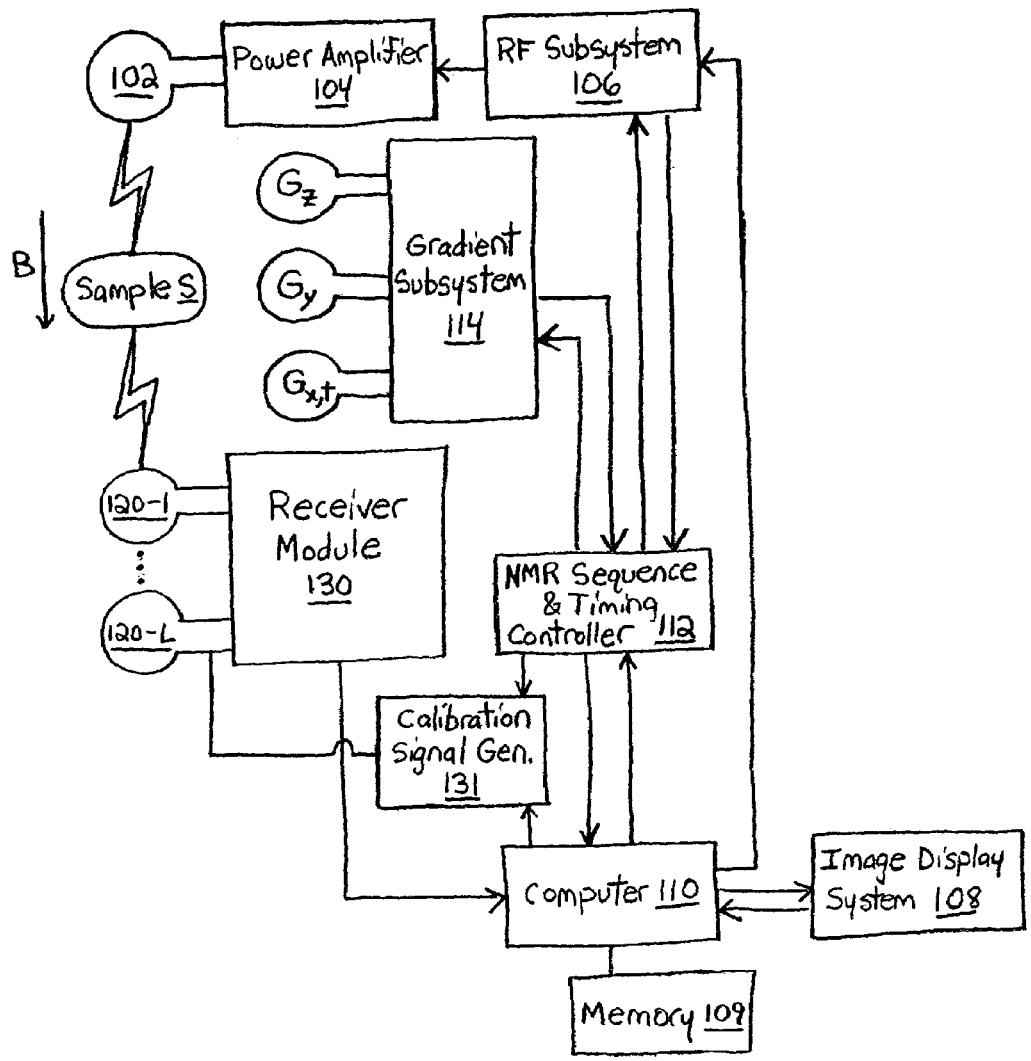
FIG. 1 is a block diagram of a magnetic resonance imaging (MRI) system according to an embodiment of the invention.

Referring to FIG. 1, a magnetic resonance imaging (MRI) system 100 has a transmitting coil 102 that injects radio frequency (RF) pulses into an imaging volume where a magnetic field B is maintained. The transmitting coil is driven by a power amplifier 104, which is in turn driven by a RF subsystem 106 under control of a computer 110 and a nuclear magnetic resonance (NMR) sequence & timing controller 112. Alternatively, transmitting coil 102 may include an array of coils for injecting RF pulses into the imaging volume. A plurality of receiving coils 120-1 through 120-L receive magnetic resonance (MR) signals, which are applied to a receiver module 130 for down-conversion to a baseband signal and error compensation. Error compensation includes phase correction and/or gain normalization. The resulting resonance signal is applied by the receiver module 130 to the computer 110 and image display system 108. Note that a single multiple-coil array may be employed to transmit the RF signal and to receive the resonance signal.

The computer 110 controls the NMR sequence & timing controller 112, which in turn controls a gradient subsystem 114 for the generation of orthogonal linear magnetic fields within the imaging volume using gradient coils Gx,t, Gy, Gz. The gradient subsystem 114 also includes a gradient waveform generator (not shown), which contains a generic waveform stored in digital form, and a phase encoding waveform. The NMR sequence & timing controller 112 controls the timing of the gradient waveform generator. In response to a pulse from the NMR sequence & timing controller 112, the gradient waveform generator outputs a particular waveform for a desired imaging sequence to each of the gradient coils Gx,t, Gy, Gz. More detailed discussions of this topic are provided in U.S. Pat. No. 4,871,966 (Smith et. al.) and U.S. Pat. No. 6,025,717 (Hertz et. al.) which are hereby incorporated by reference as if fully set forth in their entireties herein.

Broadly speaking, the receiver module 130 amplifies, digitizes, down-converts, and performs gain and phase correction of the resonance signal. Various embodiments of receiver module 130 (e.g., 130A and 130B) are shown and discussed below in further detail with reference to FIGS. 2–5.

The computer 110 is a real time computer with sub-microsecond timing precision. The computer 110 controls the overall function of the MRI system 100. In the illustrative embodiment shown in FIG. 1, computer 110 is connected to and utilizes memory 109 for storing data. The computer 110, in conjunction with the image display system 108, provides for the generation and display of images, such as two- and/or three-dimensional images, of an object through use of conventional mathematical techniques.

The NMR sequence & timing controller 112 is connected to the gradient subsystem 114 and RF subsystem 106 to provide RF sampling, timing, frequency and phase control. The NMR sequence & timing controller 112 may be a microprocessor-based timing controller or other programmable device that stores the timing of an MRI sequence. The NMR sequence & timing controller 112 generates a synchronization pulse, indicating the start of an imaging sequence, and timing pulses for synchronizing the components of the receiver module 130 (e.g., ADCs, down-converters, etc.), the RF subsystem 106, the gradient subsystem 114, and so forth. For instance, these pulses indicate when ADCs and down-converters of the receiver module 130 should sample the resonance signals. The NMR sequence & timing controller 112 similarly provides a series of pulses to the RF transmitter subsystem 106 for initiating the injection of radio frequency pulses into the imaging volume. The NMR sequence & timing controller 112 similarly controls operation of the gradient subsystem 114.

The NMR sequence & timing controller 112 includes a frequency generator (not shown) which provides a reference frequency to the digital down-converter 130 of the MRI system 100. The gradient subsystem 114 includes gradient coils Gx,t, Gy, Gz for producing orthogonal linear magnetic fields within the imaging volume. The gradient subsystem 114 may also include a gradient waveform generator (not shown) and a phase-encoding waveform stored digitally. In response to a pulse from the NMR sequence & timing controller 112, the gradient waveform generator outputs a particular waveform for a desired imaging sequence to each of the gradient coils Gx,t, Gy, Gz. A more detailed explanation of this process is given in U.S. Pat. No. 4,871,966, incorporated by reference above. A calibration signal generator 131 generates a calibration signal in response to commands from the computer 110 and synchronized by timing signals from the NMR sequence & timing controller 112. The calibration process is discussed below and in detail with reference to FIG. 9.

Figure 2:
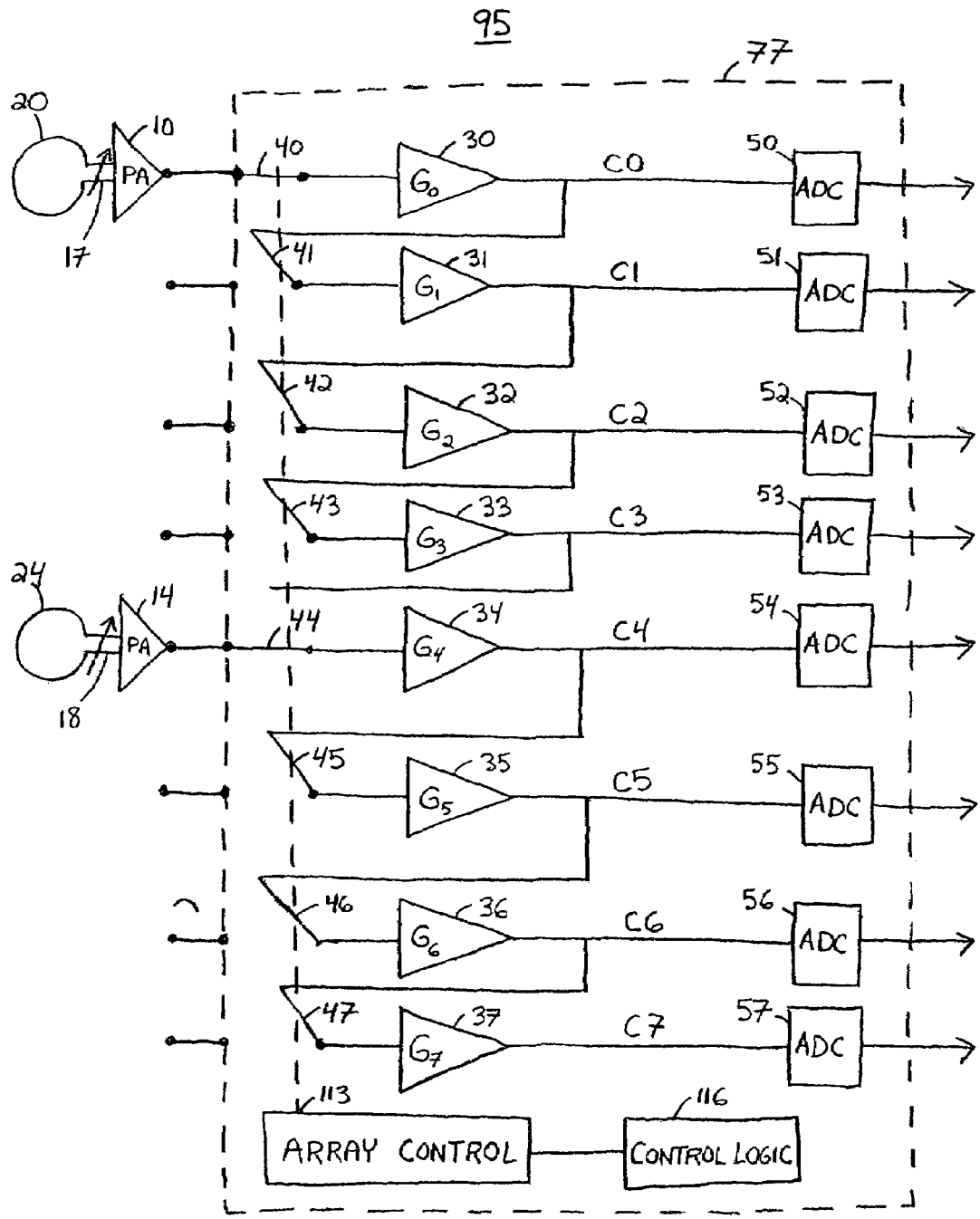
FIG. 2 is a schematic diagram of a configurable matrix coupled to an array of antennas according to one embodiment of the invention.

FIG. 2 is a schematic diagram of a system 95 which includes a configurable matrix 77 coupled to an array that includes antennas 20, 24, in accordance with an embodiment of the invention. Configurable matrix 77 comprises eight channels C0–C7, each comprising in part an amplifier 30–37 with an output electrically coupled to a respective analog-to-digital converter ("ADC") 50–57. The outputs of the amplifiers 30–36 are also configured to be selectively coupled to the input of the next amplifier 31–37, respectively, in the next channel C1–C7, through a switch 41–47. Each switch 41–47 has a first position for connection to a coil and a second position for connection to the output of the amplifier of the preceding channel. Switch 40 has a first position for connection to a coil and a second, open, position. An array control 113 controls the operation of each switch 40–47. In the illustrative embodiment shown in FIG. 2, the array control 113 is controlled by control logic 116, which may be, e.g., hardware and/or software, such as the computer 110 controlling the operation of an MRI device.

In this example, the antenna array comprises two receiving coils 20 and 24. Each coil is coupled to the configurable matrix 77 through a respective variable capacitor 17, 18 and pre-amplifier 10, 14. One receiving coil 20 is coupled to the channel C0 and the other coil 24 is coupled to the channel C4. Since the configurable matrix 77 comprises eight channels and is coupled to two coils, 4 channels may be associated with each coil. In this embodiment, the array control 113 causes the switch 40 and the switch 44 to be in the first position, coupled to the first and second coils, respectively. The Array control 113 causes the switches 41, 42, 43 and the switches 45, 46, 47 to be in their second positions, coupled to the output of the amplifier in the preceding channel. In alternative embodiments, the configurable matrix 77 may comprise additional channels, and the antenna array may comprise additional coils, as well.

In an alternative embodiment, instead of having the array control 113 automatically set the switches and assign the channels based on the number of coils in the antenna array, system 95 may be configured so that the operator of the system can set the switches, as desired.

If different sized coils are used in the antenna array, the array control 113 and/or the control logic 116 may be programmed to assign different numbers of channels to each coil. For example, if the configurable matrix 77 comprises eight channels, as in FIG. 2, and two coils, one larger than the other, 5 channels may be assigned to the larger coil and 3 channels assigned to the smaller channel based on the characteristics of each coil, by appropriately positioning the switches. A calibration process may be used to optimize the assignment of channels to coils.

The identity and characteristics of known antenna arrays may be stored in the computer 110 incorporating the system 95 of the present invention. The identity of a particular antenna array to be used may then be entered by the operator of the system. The computer or other control logic of the system may then automatically configure the configurable matrix 77 based on the stored information. The identity and characteristics of a new antenna array may be entered by an operator in a set up mode or recognized automatically through its electrical characteristics or an identification code.

In one embodiment, the type of antenna array and the number of coils may be determined based on the body part, such as an organ, to be scanned. The antenna array may optionally be a phased array antenna array.

The configurable matrix 77 of the present invention may be implemented by a semiconductor mixed signal chip that can process analog and digital signals, for example. The chip may be an application specific integrated circuit ("ASIC"), for example.

Image reconstruction is determined by the nature of the coils and whether there are overlapping volumes, as is known in the art. Images of the sub-volumes may be processed and combined to generate a uniform image of the required cross-section, or, alternatively, a number of separate images which detail the structure of the object of interest.

The present invention may be particularly useful when conducting large area or full body MRI scans with an array of coils. The present invention may also facilitate the practice of generating 3D MRI images by enabling a given receiver to process signals with relatively wide dynamic range. A configurable matrix such as that shown in FIG. 2 can detect a signal having a wide dynamic range, and produce useful measurements at all stages as the signal rises and falls in amplitude.

Figure 3:
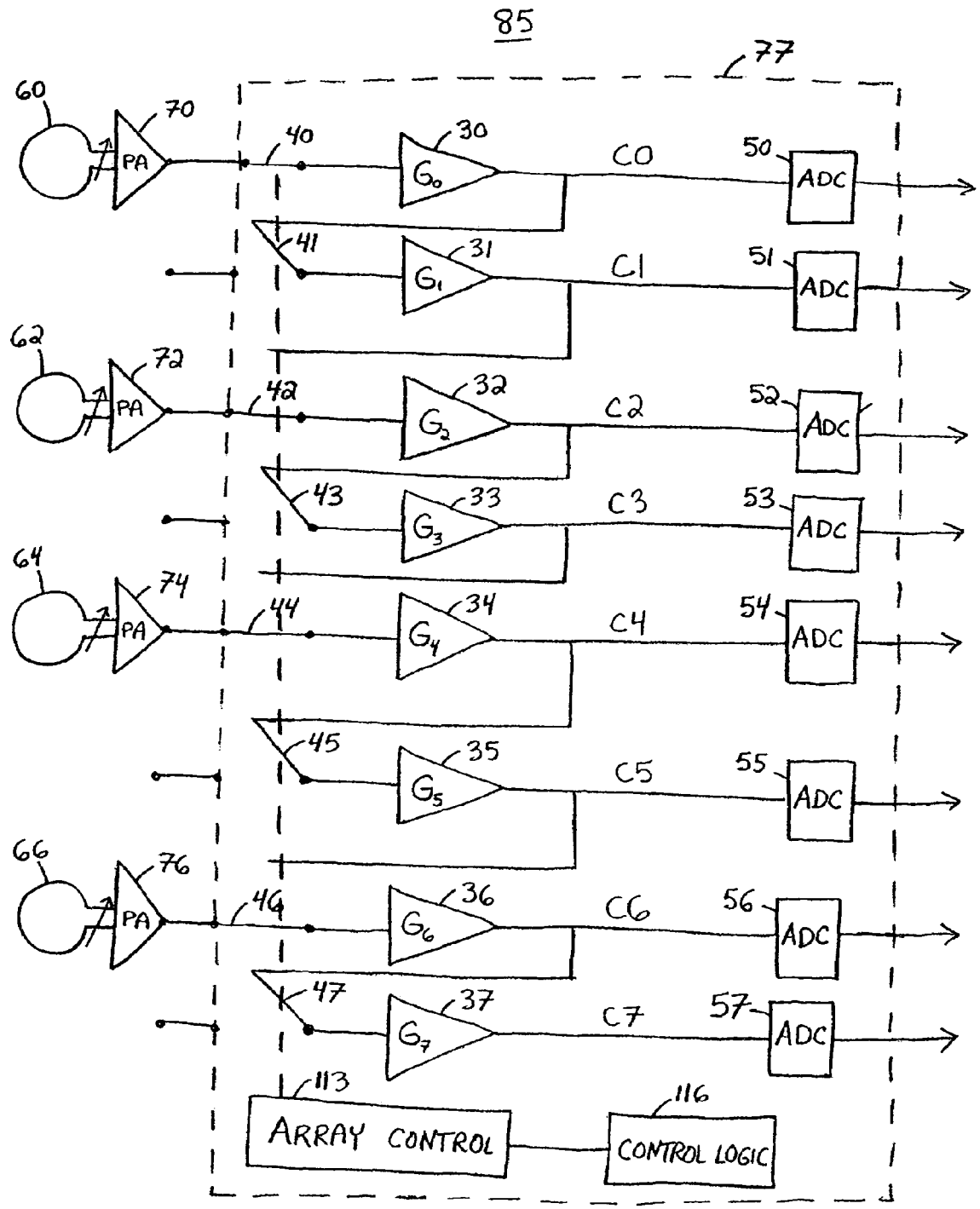
FIG. 3 is a schematic diagram of a configurable matrix portion coupled to an array of antennas according to another embodiment of the invention.

FIG. 3 is another example of a system 85 comprising the configurable matrix portion 77 and an antenna array comprising in this instance four coils 60, 62, 64 and 66. As in FIG. 1, the configurable matrix 77 comprises eight channels. To accommodate the four antennas 60, 62, 64, and 66 in this example, the array control 113 sets the switches 40–47 so that two channels are coupled to each antenna. Switches 40, 42, 44, and 46 are placed in their first positions, and switches 41, 43, 45 and 47 are placed in their second positions. Otherwise, the system 85 shown in FIG. 3 is the same as the system 95 shown in FIG. 2. In alternative embodiments, the configurable matrix 77 may comprise additional channels, and the antenna array may comprise additional coils, as well.

Figure 4:
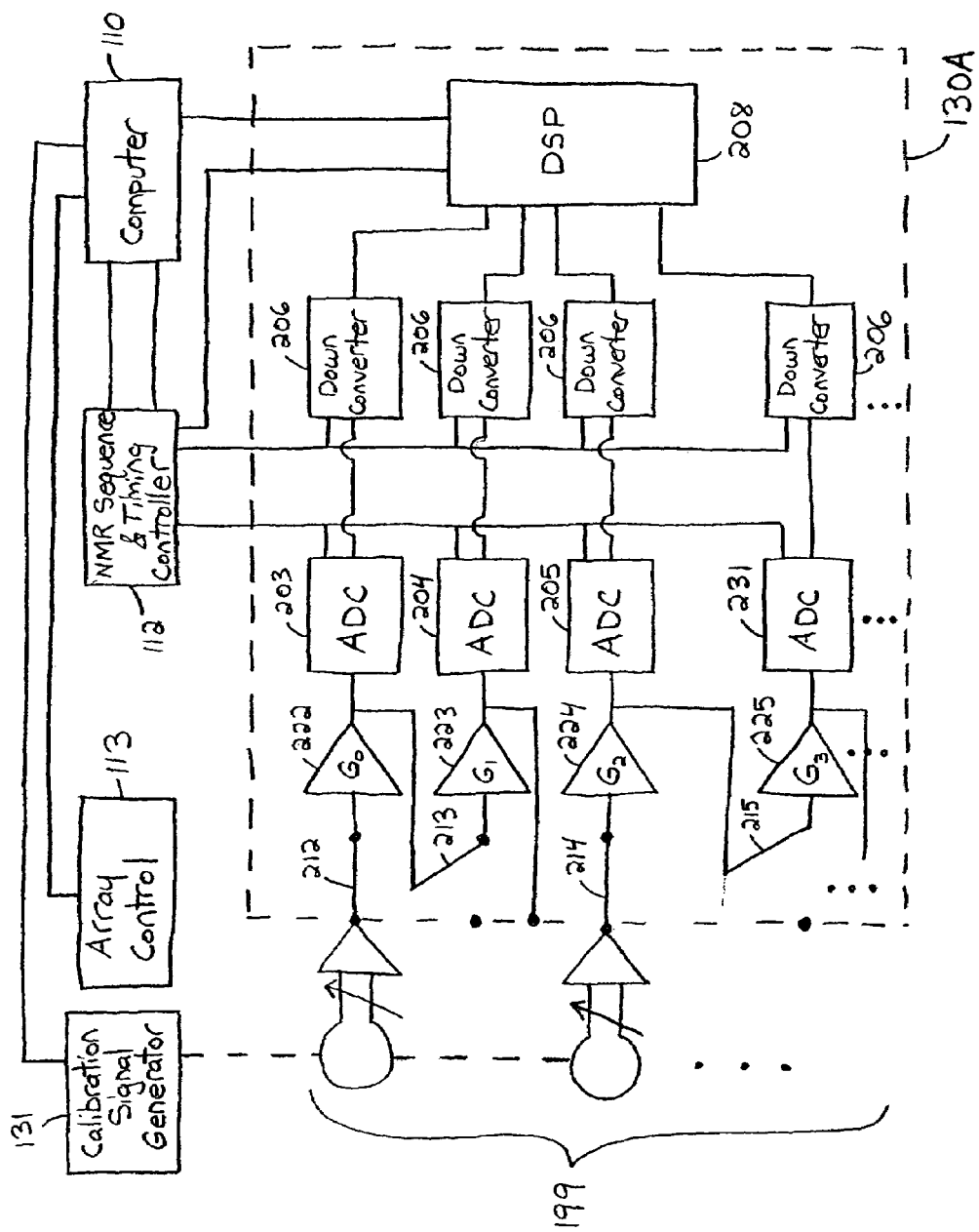
FIG. 4 is a schematic diagram of an antenna array coupled to a receiver module of the MRI system of FIG. 1 according to one embodiment of the invention.

FIG. 4 shows an antenna array 199, comprising two receiving coils in this instance, coupled to a configurable matrix receiver 130A. The amplifiers of the configurable matrix receiver 130A are in a configurable matrix, as described above with respect to FIG. 2. The configurable matrix receiver 130A comprises four channels, two of which are associated with each coil. In alternative embodiments, the receiver 130A may comprise additional channels, and the antenna array 199 may comprise additional coils, as well.

In this embodiment, each amplifier 202 provides a respective gain (G0, G1, G2, G3 . . . Gn). The amplifiers 222 can have a fixed or variable gain, but are preferably of fixed gain. Each amplified signal output by a respective amplifier 222 is applied to a respective ADC 203, 204, 205, 231, which converts the signal to a digital output.

The output of each amplifier 222–224 is also configured to be selectively coupled to the input of the next amplifier 223–225, respectively, through a switch 213–215. Each switch has a first position for connection to a coil and a second position for connection to the output of the amplifier of the preceding channel. Switch 212 has a first position for connection to a coil and a second, open, position. An array control 113 controls the operation of each switch 212–215. The array control 113 may be hardware or software controlled by logic, such as a computer 110 controlling the operation of an MRI device, or other control logic.

The output of each ADC is then digitally down-converted, by a respective down-converter 206, to baseband. The ADCs 203, 204, 205, 231 may have identical or different input ranges (e.g., 12-bit, 14-bit, etc.) and may include anti-aliasing filters as required to avoid aliasing of the input signal. The down-converted signals from the digital down-converter 206 are then applied to a digital signal processing circuit (DSP) 208 configured to select the digital signal with the highest signal-to-noise ratio whose ADC 203, 204, 205, 231 is not over-saturated. Switching may be governed by comparing the signal levels to the known ranges of the ADCs 203, 204, 205, 231 or responsively to the over-range flags of the ADCs 203, 204, 205, 231. This may be accomplished by comparing the signals to each other to determine the signal that fills the ADCs 203, 204, 205, 231 with the highest dynamic range. In other words, the channel with the highest amplification that does not over-saturate its ADC 203, 204, 205, 231 is selected by the DSP 208. Still another way to describe this function is that the channel is selected which results in the lowest distortion of the analog signal by conversion to digital form.

There are at least these three kinds of distortion that can occur:

(1) An analog signal with a small amplitude applied to the ADC 203, 204, 205, 231 with a large input amplitude range may have an analog noise level that is lower than the least significant bit of the ADC 204. This results in quantization noise, which is a type of distortion.

(2) An analog signal, whose amplitude over-saturates the input of an ADC 204, is clipped, which is also a distortion.

(3) An analog signal that has noise added to it by and following the amplifier.

Accordingly, a first type of signal received by the DSP 208 from ADCs 203, 204, 205, and 231 is a signal that is "lost" in the quantization noise because its maximum amplitude is less than the step size of the respective ADC. These signals contains no useful information. A second type of signal received by the DSP 208 is a signal that has been clipped because its maximum amplitude exceeds the measuring capacity of the respective ADC. A third type of signal fits within the range of the ADC, but contains a certain amount of added noise. The DSP 208 selects from among these signals that signal which has the highest amplification and does not oversaturate its respective ADC. Thus, the configuration of the channel selection circuitry (or programming, depending on the type of DSP) can be tersely characterized as being one that selects the channel with the lowest distortion.

The signal on the selected channel is multiplied, in the DSP 208, by a complex coefficient that corrects for gain and phase distortion due to amplification and analog and digital signal conditioning to ensure uniform scale and phase alignment of the signals used for imaging. The gain and phase correction coefficients may be based on tables prepared during a calibration process that employs a fixed calibration signal, a procedure for which is discussed further below.

The DSP 208 may also perform other signal/data processing, such as filtering the selected signal. For example, the DSP 208 may band-limit the data to remove noise. The data may be stored along with other data for processing by the computer 110 and displayed by the image display system 108. The data may be processed to generate two- and three-dimensional images using known mathematical techniques.

Again, the NMR sequence & timing controller 112 generates timing pulses for clocking the various subsystems of the receiver module 130A, such as the ADCs 203, 204, 205, 231, digital down-converters 206 and the DSP 132, thereby synchronizing the components of the receiver module 130A.

Figure 5:
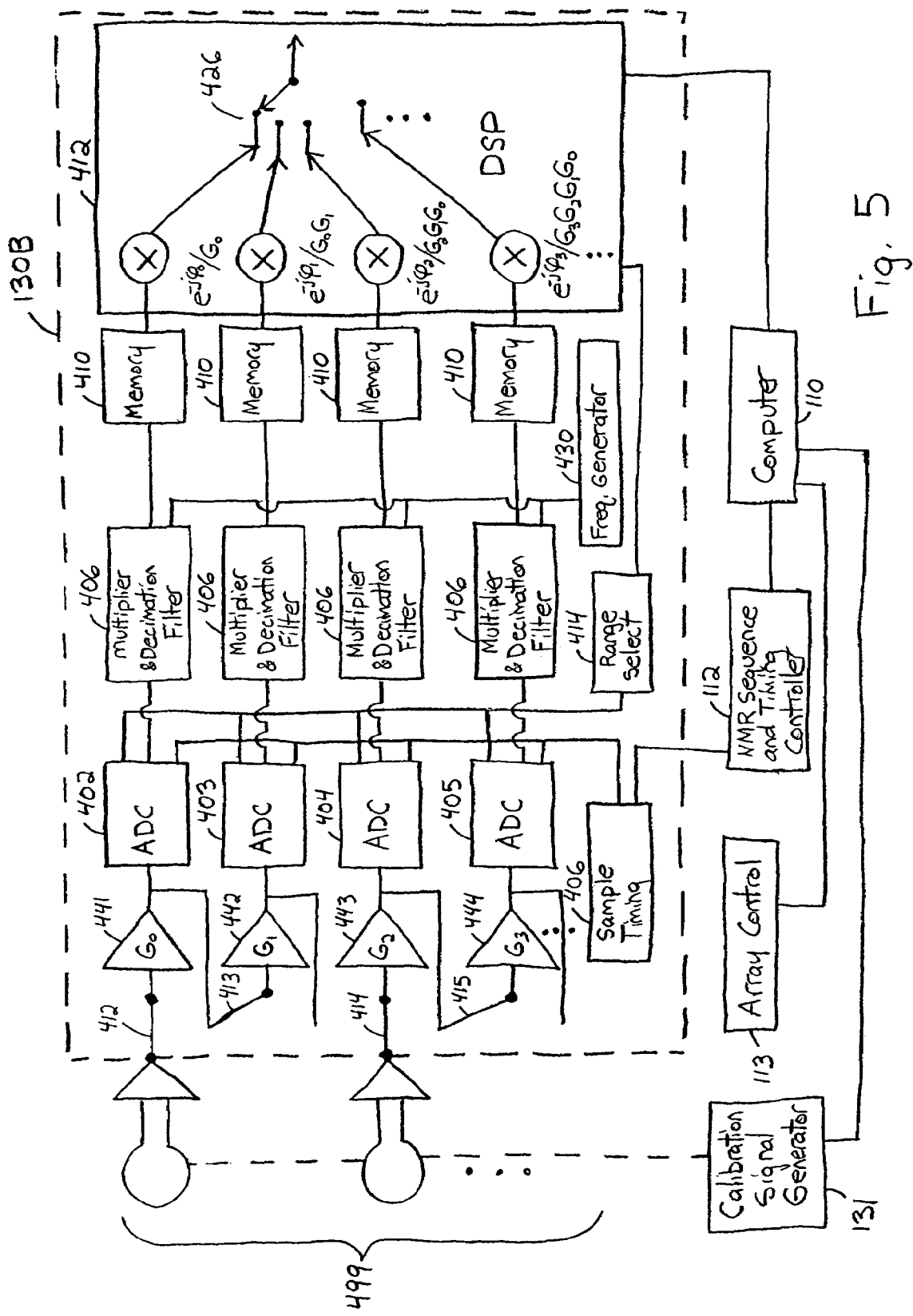
FIG. 5 is a schematic diagram of an antenna array coupled to a receiver module of the MRI system of FIG. 1 according to another embodiment of the invention.

FIG. 5 shows a two antenna array 499 coupled to a configurable matrix receiver 130B. Once again, the amplifiers of the configurable matrix receiver are in a configurable matrix, as described above with respect to FIG. 2. Here, the configurable matrix receiver 130B comprises four channels, two of which are associated with each coil. The configurable matrix receiver 130B may comprise additional channels and the antenna array 499 may comprise additional coils, as well.

In this embodiment, the configurable matrix receiver module 130B directly converts the resonance signal to digital form and performs down-conversion digitally as in FIG. 4. In the embodiment of FIG. 5, however, a particular method of down-conversion—by means of multiplication followed by decimation—is employed. The output of the amplifiers 441–443 are also configured to be selectively coupled to the input of the next amplifier 442–444, respectively, through a switch 413–415. Each switch 413–415 has a first position for connection to a coil and a second position for connection to the output of the amplifier of the preceding channel. Switch 412 has a first position for connection to a coil and a second, open, position. An array control 113 controls the operation of each switch 412–415. The array control 113 may be hardware or software controlled by logic, such as the computer 110 controlling the operation of an MRI device, or other control logic. The output of each amplifier 441–444 is applied to a respective ADC 402–405 controlled by a high frequency sampling timing source 405 (i.e., a clock). Again the ADCs 402–405 can be different or identical components. The resulting digitized signals are applied to corresponding multiplier/decimation filter modules 406, which digitally down-convert the digital signal by multiplying the corresponding input signals by an output from a numerical frequency generator 430, whose output is synchronized with the rest of the receiver 130B. The output of the numerical frequency generator 430 is a sinusoidal signal at the Larmor frequency. (In this context, the Larmor frequency is defined as the precessional frequency of magnetic nuclei in a plane perpendicular to the direction of the external magnetic field). The frequency generator 430 may be of any suitable construction, one example being a lookup table storing a sine function and clocked in synchrony with the other components of the receiver 130B. The demodulated signal may then be decimated and output. Each of decimated signals is stored in a corresponding memory 410, and thereafter, accessed in first-in first-out (FIFO) fashion and applied synchronously to the DSP 412. It goes without saying that memories 410 need not be discrete components and can be portions of a single memory device. The delay registers 410 make up for the different clocking rates of the decimated signal versus the signal prior to decimation.

The DSP 412 multiples each of the signals with a complex multiplier to correct for phase distortion and gain $(1/G)e\text{-}j\phi n$ where G is the respective gain applied to the signal (e.g., G0, G1G2, G0G1G2, G0G1G2G3, ..., or G0G1G2G3 .... Gn); and $\phi n$ is a phase angle difference introduced by the analog amplification process respective to amplifier n. The DSP 412 thereafter selects, by way of a switch 426, one of the signals from the plurality of normalized signals according to an output of a range select module 414.

As shown, the range select module 414 receives signals from the over range-flags of the ADCs 402–404, and provides an indication to the DSP 412 of which signal has the highest SNR. The signal from the over-range flags of the ADCs 402–405 indicate when corresponding ADCs 402–405 are over-saturated. That is, the best SNR will be provided by the channel with the highest amplification whose ADC 402–405 is not over-saturated (with due consideration for any lag required to provide a sufficient number of samples for demodulation, as discussed below with reference to FIGS. 6 and 7).

At any given moment, the range select module 414 provides a logic signal whose output indicates which channel should be used. The signal could be provided by various different mechanisms, one being control logic that climbs the channels in the direction of highest gain to lowest gain, skipping all channels whose ADCs 441–444 are over-saturated. Those channels whose ADCs 402–405 are over-saturated are producing data that is unusable.

The switching is fast enough that it can be performed in real-time, since the data are relatively slow-moving compared to digital processor speeds, the former being only in the kilohertz range. Thus, the matching of signal dynamic range to the ADC 402–405 can always be as good as the resolution provided by the intervals between the different gain factors. However, the switching of channels is constrained by the fact that the demodulation process may require a minimum number of samples (for low pass filtering).

Providing more channels, each with smaller respective differences in gain, allows the mapping of signal strength variation to better track the ADC range than providing fewer channels with greater respective differences in gain. Note that channel selection by switch 426 can be accomplished in various ways. A set of analog window-detectors (each using a pair of comparators with different threshold limits) could be used for this purpose. Alternatively, a single ADC, to which the entire resonance signal is mapped, can be configured to compare its output to numerical upper and lower bounds (windows) for each channel and appropriate logic used to drive the selection. The entire DSP 412 can be created in various ways, including an application-specific integrated circuit (ASIC) and in software, using a programmable embedded system, for example.

The DSP 412 may also perform other signal processing, such as filtering the digital signal. The data may be stored along with other data for processing by the computer 110 and display by the image display system 108. The data may be processed to generate a two dimensional image, or a three dimensional image, using known mathematical techniques. Again, the NMR sequence & timing controller 112 provides timing pulses to synchronize the subsystems of the receiver module 130B.

The above embodiments of the configurable matrix receiver 130 can be calibrated once for many imaging sequences, even when the sample is changed between imaging sequences. This is because the amplifier gain is not changed in any of these embodiments. As a result, the phase- and gain- normalization coefficients are fixed, and, once determined by calibration, need not be measured over and over unless significant changes to the magnetic field intensity are made, which would affect the Larmor frequency. The receiver can therefore be equipped with an oscillator (not shown) for generating a Larmor frequency, which can be switched into the receiver coil 120 circuit for calibration.

The coefficients for gain and phase correction may be derived in various ways. For example, the gain correction can be obtained by precisely measuring the gain of the amplifiers 202, 441–444 and generating a lookup table correlating the gain ratio and the channel. The phase correction parts of the complex correction coefficients can be obtained by generating a test signal and measuring the phase differences between the signals on each channel. This could also be done with an actual NMR signal during a short calibration process. The latter would capture a sample signal in a memory and search for a peak in the mutual correlation function with respect to one of the channels.

Figure 6:
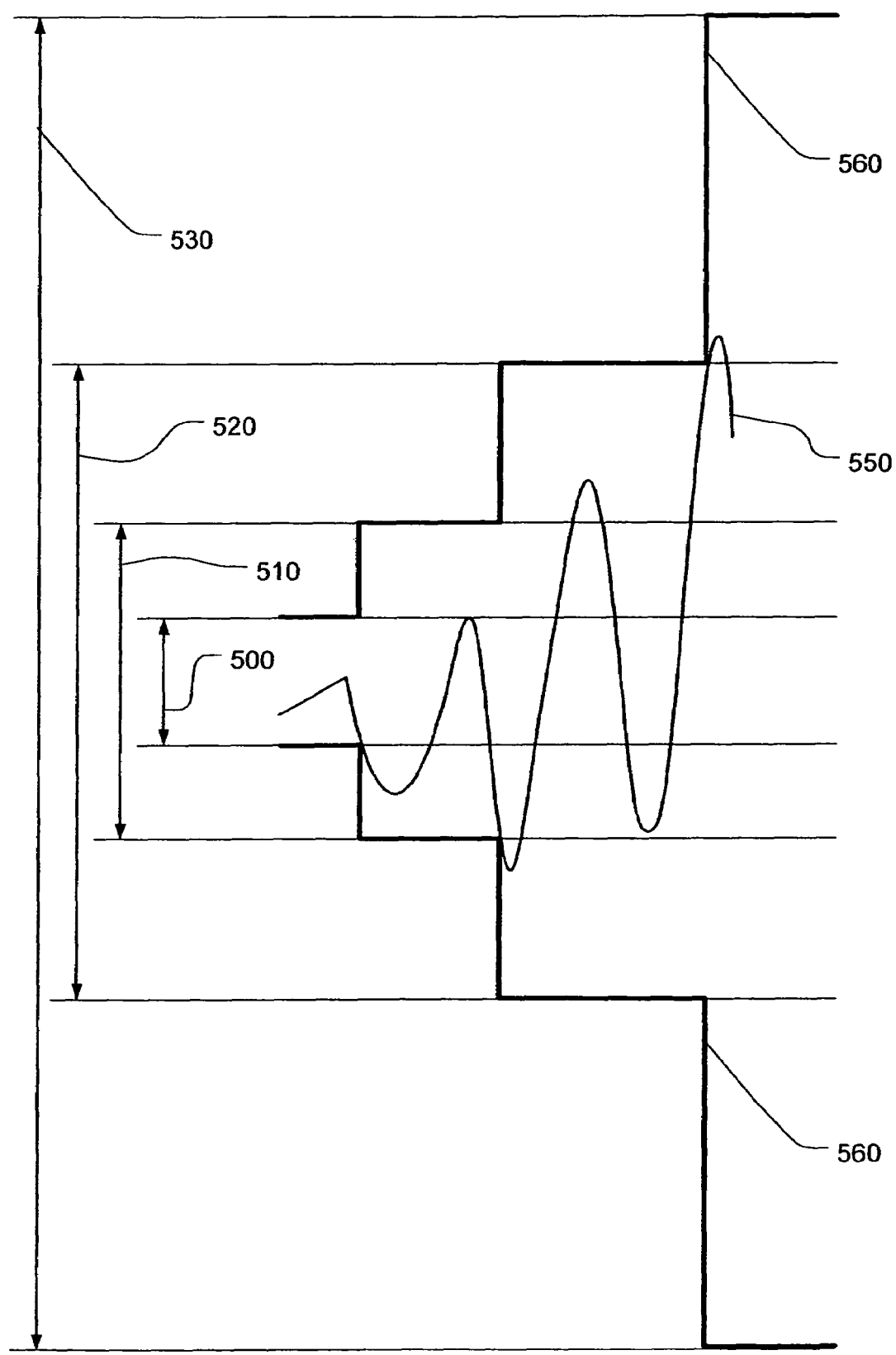
FIG. 6 is a figurative illustration of a portion of a resonance signal versus time, or a portion of a resonance signal envelope varying with phase encoding level, mapped against amplitude ranges for the signal conditioning channels consistent with the embodiments of FIGS. 4–5.

Referring to FIG. 6, a portion of a resonance signal, indicated by the curve 550, is illustrated in relation to four amplification ranges, each corresponding to one of the channels of the configurable matrix receiver 130A–130B embodiments of FIGS. 4 and 5. The highest gain channel corresponds to the amplitude range designated by 500. The second-to-highest gain corresponds to the range designated by 510, and so forth for ranges 520 and 530, the range 530 corresponding to the range of resonance signal amplitude that can be applied to the lowest gain amplifier without over-saturating. Continuous lines 560 indicate the currently selected range for the highest gain channel whose ADC is not over-saturated.

Note that the curve 550 can also represent, in FIG. 6, the peak amplitude envelope of the resonance signal as it varies with phase encoding level. In other words, the same curve can represent either orthogonal view in K-space. According to this interpretation, the selected channel 510–530 is based on the peak amplitude for a given phase encoding level and not in real time. To permit this, as discussed elsewhere in the present specification, a calibration run to obtain the peak amplitudes for each phase encoding level may be performed and the channel selected according to a lookup table resulting from that calibration procedure.

Figure 7A:
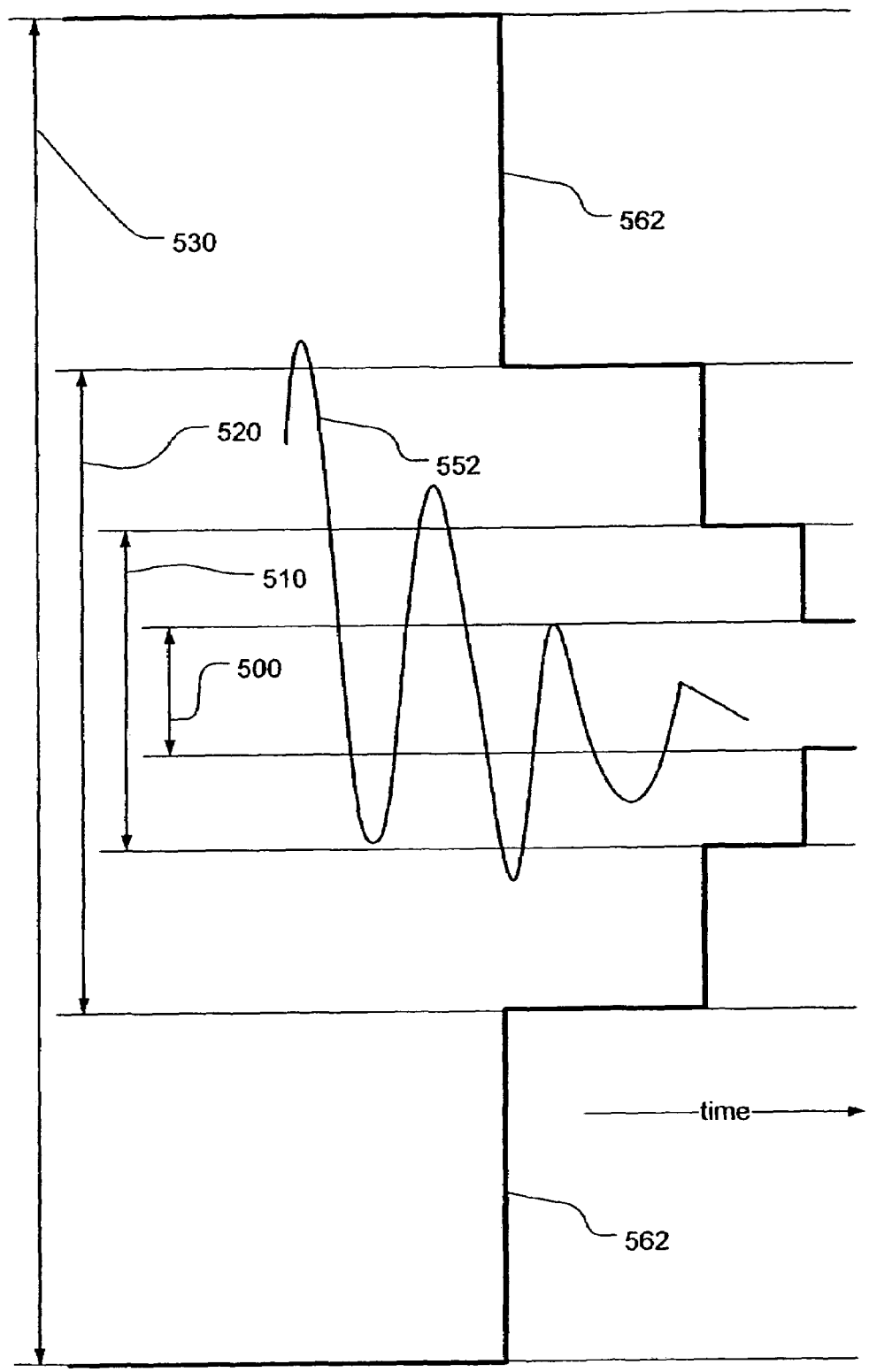
FIG. 7A is a figurative illustration of another portion of a resonance signal versus time mapped against amplitude ranges for the signal conditioning channels consistent with the embodiments of FIGS. 4–5.
Figure 8:
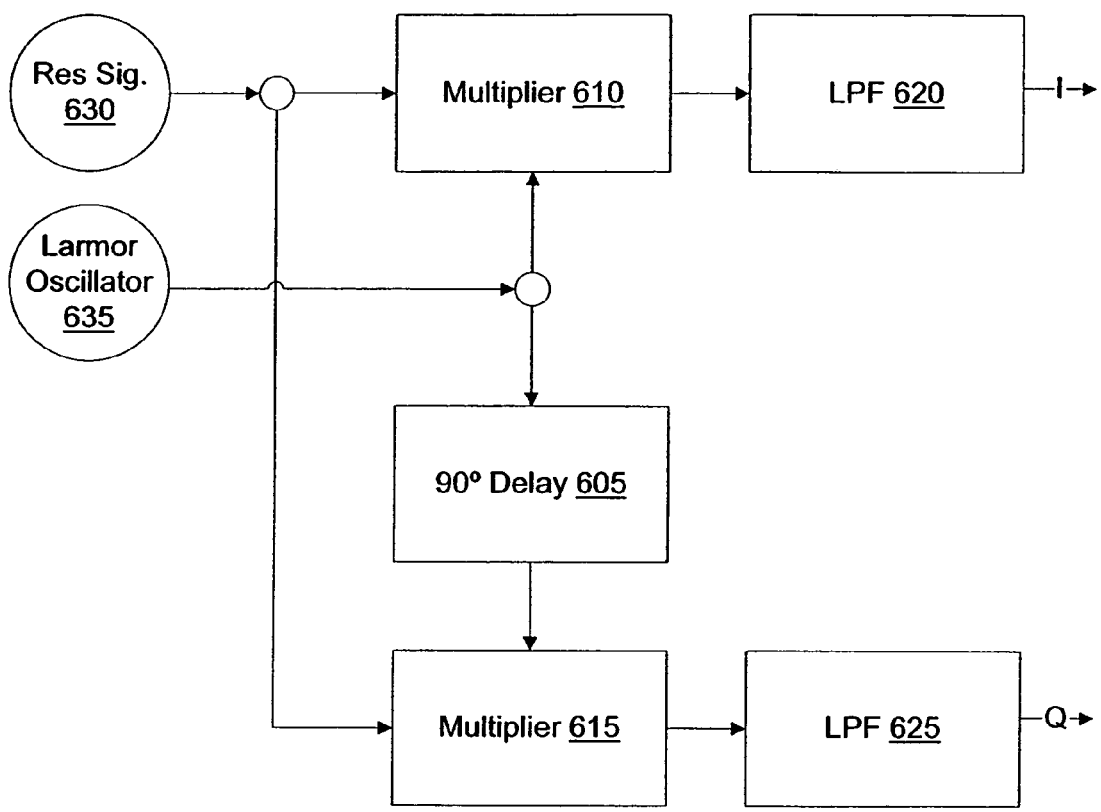
FIG. 8 is an illustration of an I-Q demodulator for digitally down-converting a resonance signal according to an embodiment of the invention.

Referring now to FIG. 7A, where the curve 552 now represents the time-varying resonance signal for a given phase encoding level, note that the lines 562 do not indicate that the currently selected range falls back to a higher gain channel immediately after the signal 552 drops below the saturation level of the next higher gain channel. Rather, a delay (or minimum number of samples) is required before switching to a higher gain channel. Referring momentarily also to FIG. 8, demodulation requires a minimum interval of time (or number of samples) after the raw signal falls below the level at which the next higher-gain channel's ADC is over-saturated in order for that component to begin demodulating again. The modulated signal is applied to a pair of multipliers 610 and 615, which multiply a reference signal from a Larmor oscillator 635 with the resonance signal. One of the multipliers 610 is an inline (I)-component multiplier 610 to which the reference signal is applied without phase rotation. The other is a quadrature (Q)-component multiplier 615 to which the reference signal is applied with 90° phase rotation. Low pass filters (LPFs) 620 and 625 remove the high frequency components of the I- and Q-component products yielding only the I- and Q-component components of the baseband signal. Because of the need to filter out the high frequency products using the LPFs 620 and 625, some minimum number of samples (or length of time for analog down-conversion) is required after a higher gain channel stops being clipped. In a digital signal, the extra samples required for low pass filtering are those falling under the convolution kernel defining the low pass (band pass) filter 620, 625.

As discussed, control of the currently-selected channel cannot be governed solely by the criterion of highest gain without clipping and must take into account a minimum interval after a channel's signal stopped being clipped by saturation of the ADC to begin providing a demodulated signal. Moving from a high gain channel to a lower gain channel does not require any lag since the lower gain channel is not clipped during the time the higher gain channel was selected. Referring to FIG. 7A, as the raw signal 552 amplitude drops, the selected channel moves to higher and higher gain, again with appropriate consideration given to the need for an adequate number of samples to be processed in the down-conversion process. Note that for analog down-conversion, the issue is not the number of samples, but an interval of time, since the down-converter is operating on an analog signal. The step of low pass filtering would be followed by decimation, which is not illustrated.

Figure 7B:
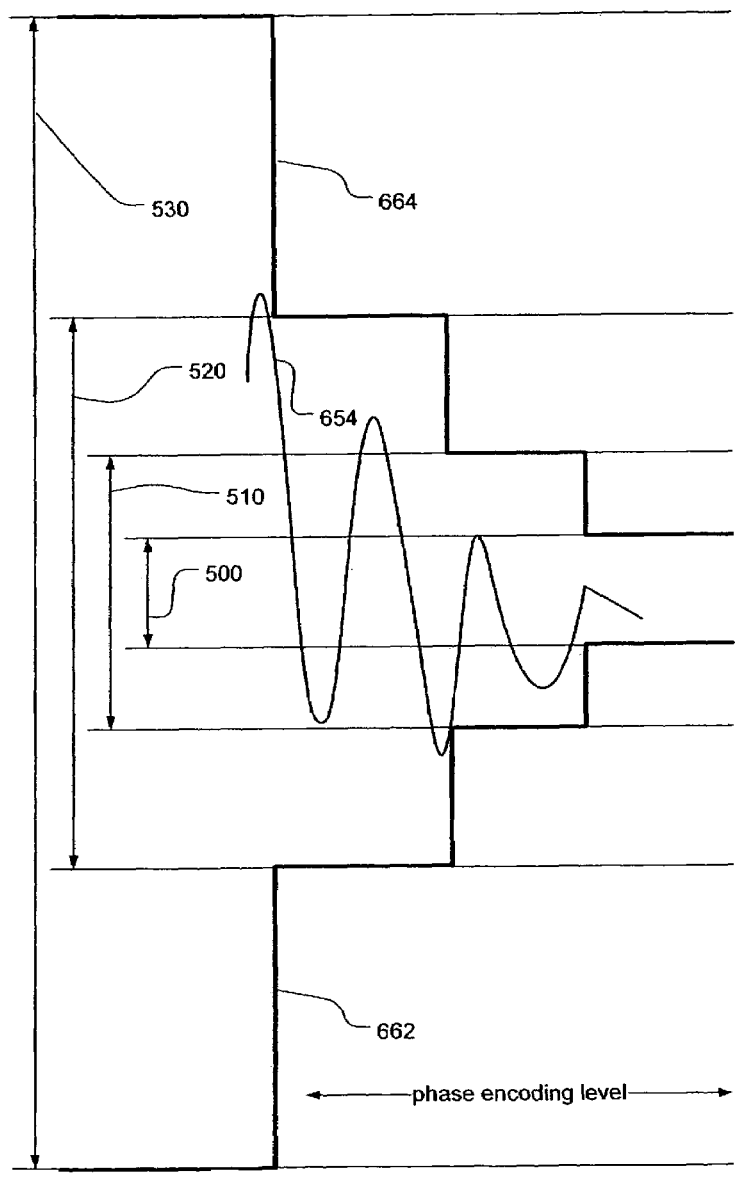
FIG. 7B is a figurative illustration of another portion of a resonance signal envelope varying with phase encoding level, mapped against amplitude ranges for the signal conditioning channels consistent with the embodiments of FIGS. 4–5.

Referring now to FIG. 7B, the peak resonance signal envelope 654 is shown varying with phase encoding level. Here, the concern about convolution is not present, since the figure represents peak amplitude versus phase encoding level. Thus the channel selected can be based on the peak amplitude without any "delay" interval as illustrated in FIG. 7A.

Note that in any of the embodiments, it is also possible, with sufficiently accurate phase alignment of the reference signal with the modulated signal, to accomplish the downconversion without convolution by sampling the modulated signal at the same phase angle of the carrier. In practice, this is an unreliable method and multiplication is preferred. However, it permits the switching from low gain to high gain more quickly than illustrated in FIGS. 6 and 7 since a narrow convolution kernel (or no convolution) may be used.

In one embodiment, the channel may be selected and fixed in a lookup table for a given phase encoding level, in which case no switching of channels would occur in the situation illustrated in FIG. 6. One of the channels would be selected depending on the peak amplitude for the particular phase encoding level. Rather, the signal illustrated would require that that the lowest gain channel, indicated by range 530, would be used for the whole signal corresponding to a single phase encoding level.

Figure 9:
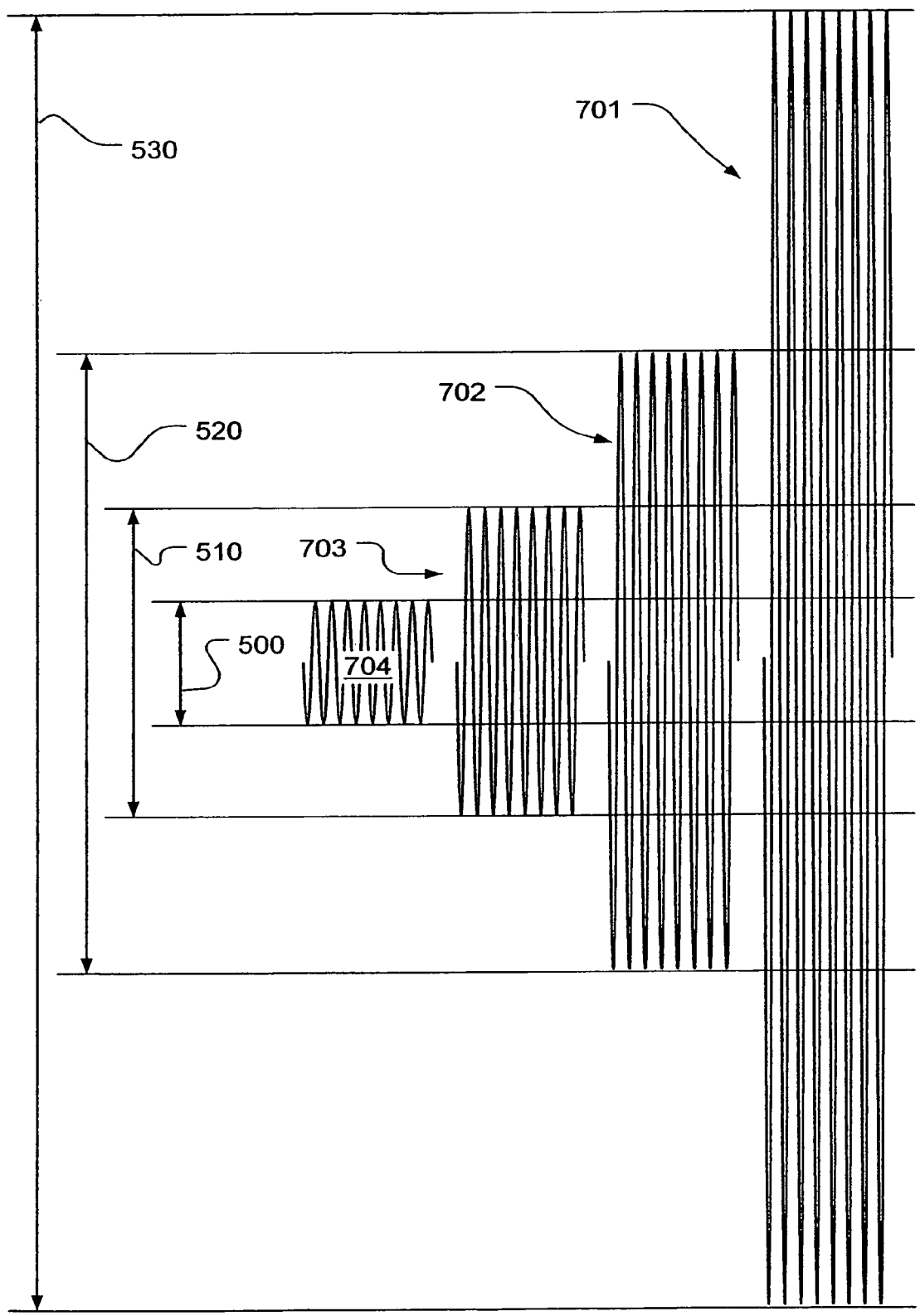
FIG. 9 is an illustration of a set of calibration signals for purposes of describing a calibration procedure according to an embodiment of the invention.

Referring now to FIG. 9, the calibration of some embodiments of the invention, for example as illustrated in FIG. 4 or 5, involves applying a resonance signal, preferably at the Larmor frequency, to the analog input of the receiver module 130. The purpose of the calibration is to derive the gain and phase correction factors to be applied to the respective digital signals for each channel such that they are all gain-and phase-normalized. The samples output by the DSP 412 must all represent the same signal magnitude and must all be temporally synchronized such that at any moment, every sample represents the resonance signal at the same phase angle (except for the fact that some channels may be overdriven) and indicates the same magnitude.

The calibration procedure begins by transmitting a first signal 704 whose amplitude is at the highest level that does not overdrive the highest gain channel 500. This signal will simultaneously be available on all the other channels, since their gains are lower. A gain correction and a phase correction may be calculated for the next lower-gain channel relative to the highest-gain channel. Next, the calibration signal amplitude is increased until it nearly saturates (or saturates) the second-highest-gain channel. The signal would then over-range the first channel, but would still be readable by the third-highest-gain channel. The gain and phase correction for the third-highest-gain channel may then be calculated. This continues until a correction for each channel, relative to its respective next-lowest-gain channel, is obtained.

Figure 10:
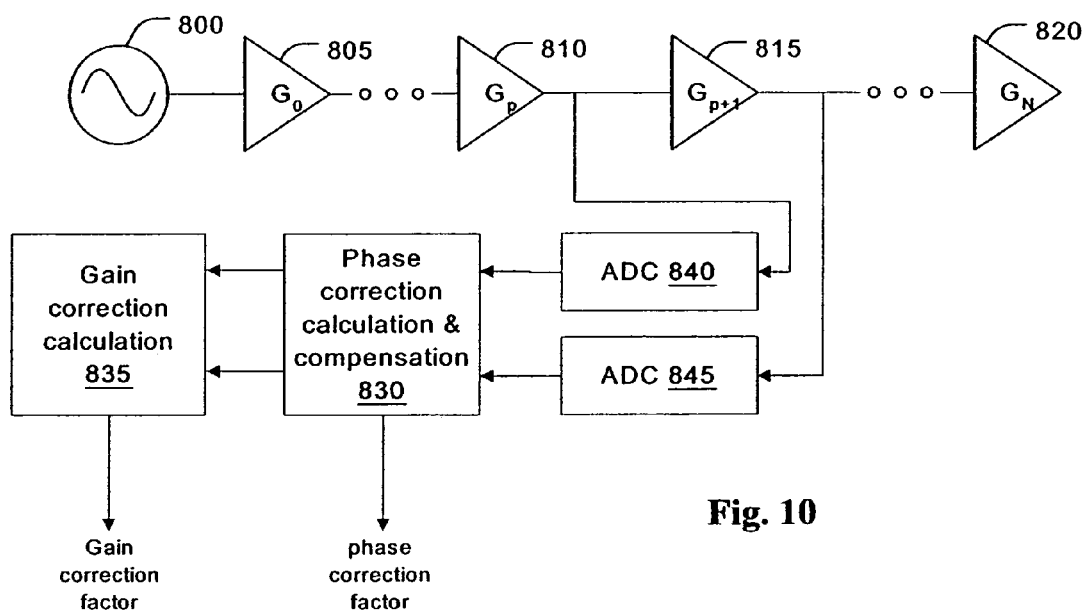
FIG. 10 is an illustration of a receiver for purposes of discussing a calibration process according to an embodiment of the invention.
Figure 11:
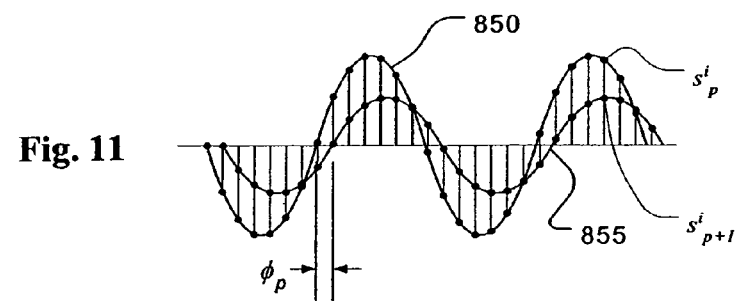
FIG. 11 is an illustration of a sample sequence of an analog signal prior to phase correction of the signal according to an embodiment of the invention.

Referring now to FIG. 10, the calibration signal is applied to amplifiers 805–820, which may corresponds to the amplifiers 441–444 of FIG. 5. Signals of different amplification levels (preferably adjacent in magnitude, but not necessarily) are applied to respective ADCs 840 and 845 as described above for the calibration procedure. The signals output by the ADCs 840 and 845 are illustrated in FIG. 11. Here, a phase difference Op between the signals from the two ADCs 840 and 845 is illustrated with interpolation curves 855 and 850, respectively, joining the ADC samples. As can be seen in the illustration, the signals have identical frequencies, but differ in terms of phase and magnitude.

Figure 12:
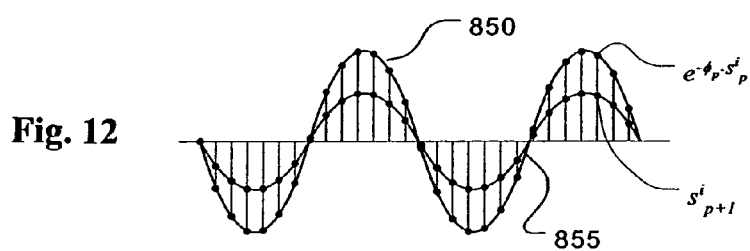
FIG. 12 is an illustration of the sample sequence of FIG. 11 after phase correction of the signal according to an embodiment of the invention.

The respective samples, not yet corrected for phase mismatch, are applied to a phase correction calculation and compensation process 830 which receives a large number of samples to cumulate an accurate determination of the phase difference. This can be done by averaging the differences between the zero crossing determined by interpolation, but a preferred method of doing it is to perform a complex FFT on the samples and then average the phase difference over a sufficient number of iterations to reduce the error to a desired level. The phase correction calculation and compensation process 830 calculates correction factors and applies them to the signals. FIG. 12 illustrates the signals with a correction applied to the higher gain signal to align it with the lower gain signal. Of course, since all the signals from all the channels are ultimately to be aligned and ordinarily a correction factor would have to be applied to every signal, except possibly one selected represent a reference phase angle.

The gain correction is obtained from the phase-corrected signals by averaging the magnitude ratios for a large number of samples. That is, the gain Gp of channel p relative to channel p+1 is the ratio of the sums of the absolute values of the samples sip over many samples:

$$G_p = \frac{1}{M} \frac{\sum_{i=1}^{M} |S_{p+1}^i|}{\sum_{i=1}^{M} |S_p^i|}$$

where sip is the sample i of channel p.

The above calibration procedure can provide highly accurate phase and gain corrections by using averaging to reduce the effect of random error. The noise factor in each resonance signal during imaging, as discussed above, remains no matter how precise the calibration. As discussed above, the noise in the analog signal and injected during analog processing (including conversion to digital) and the quantization error (quantization error) are two principal sources. An embodiment of the invention, by varying the effective gain at which the signal is converted to digital form, reduces the quantization error by $\log_2(c+1)$ bits for each channel added, where c is the number of channels and assuming that we start with one and each adjacent channel is higher than the next lower gain channel by a factor of 2. The effect is to make it easier to satisfy the requirement that the unavoidable input noise will be below the least significant bit of the ADC to avoid appreciable quantization noise.

It should be noted that the embodiments shown in FIGS. 4 and 5 allow a single image to be generated using data from multiple signals having different gain factors. Applying phase correction in such a situation is crucial because, generally, if an image is generated using data from multiple signals with different phases, the resulting image will exhibit aliasing effects such as blurriness and other edge artifacts. For this reason, in these embodiments, when an image is generated from multiple signals with different gains, phase correction is performed for each signal after the gain is applied and before the image is generated.

It will be apparent to those skilled in the art that various modifications and variations can be made in the system and processes of the present invention without departing from the spirit or scope of the invention. Thus, it is intended that the present invention covers the modifications and variations of this invention provided they come within the scope of the appended claims and their equivalents. In this context, equivalent means each and every implementation for carrying out the functions recited in the claims, even if not explicitly described herein.

For example, the embodiments illustrated by FIGS. 2 through FIG. 5 are disclosed herein in a form in which various functions are performed by discrete components. However, in various alternative embodiments, any one or more of these functions could equally well be integrated and performed by a single component, such as a processor. It should also be noted that any one or more of these functions may be performed by one or more software applications.

What is claimed is:

1. A digital signal processing system for processing one or more signals, comprising:
   a first antenna to detect a first signal and to generate a first output signal;
   a second antenna to detect a second signal and to generate a second output signal; and
   a configurable matrix to process at least one of the first and second output signals, the matrix comprising:
      a first amplifier having a first input and a first output, wherein the first input of the first amplifier is selectively coupled to the first antenna;
      a second amplifier having a second input and a second output;
      a switch having a first position coupling the first output of the first amplifier to the second input of the second amplifier, and a second position coupling the second input of the second amplifier to the second antenna;
      a first analog-to-digital converter (ADC) coupled to the first output of the first amplifier; and
      a second ADC coupled to the second output of the second amplifier.

2. The system of claim 1, wherein the first output of the first amplifier is coupled to the second input of the second amplifier via one or more additional amplifiers.

3. The system of claim 1, wherein the first and second signals include at least one magnetic resonance (MR) signal.

4. The system of claim 1, wherein at least one of the first and second antennas includes a receiving coil in a Magnetic Resonance Imaging (MRI) system.

5. A signal processing system for receiving and processing signals, comprising:
   a first antenna to detect a first signal and to generate a first output signal;
   a second antenna to detect a second signal and to generate a second output signal; and
   a configurable matrix receiver to process at least one of the first and second output signals, comprising:
      a first amplifier having a first input and a first output, wherein the first input of the first amplifier is selectively coupled to the first antenna;
      a second amplifier having a second input and a second output;
      a switch having a first position coupling the first output of the first amplifier to the second input of the second amplifier, and a second position coupling the second input of the second amplifier to the second antenna;
      a first analog-to-digital converter (ADC) coupled to the first output of the first amplifier to generate a first digital signal;
      a second ADC coupled to the second output of the second amplifier to generate a second digital signal;

the system further comprising:
      a digital signal processor (DSP) to select a digital signal from among the first digital signal and the second digital signal.

6. The system of claim 5, further comprising at least one additional antenna.

7. The system of claim 5, wherein the DSP receives the first and second digital signals, selects a one of the digital signals having a lowest distortion, and corrects for lack of phase coherence and differing gain in the digital signals, whereby the selected digital signal remains normalized with respect to others of the digital signals when the others are selected.

8. The system of claim 5, wherein the DSP minimizes quantization error by selecting a digital signal with the highest gain that does not cause saturation of an input of a corresponding one of the ADCs at any point of a single phase encoding level.

9. The system of claim 5, wherein the ADCs have respective overflow flags and the DSP is further configured to select the one of the digital signals responsively to the overflow flags.

10. The system of claim 5, wherein the DSP is configured to select the one of the digital signals responsively to a lookup table correlating maximum expected analog resonance signal levels with corresponding ones of said digital signals to be selected.

11. The system of claim 10, wherein the maximum expected analog resonance signal levels each corresponds to a particular phase encoding level.

12. The system of claim 10, wherein the look-up table is configured to indicate a one of the digital signals for selection which provides a highest gain factor such that amplification of the analog resonance signal does not oversaturate an input of a corresponding one of the ADCs.

13. The system of claim 5, further comprising at least one digital down-converter connected between an ADC and the DSP.

14. The system of claim 13, wherein the digital down-converter comprises a multiplier.

15. The system of claim 14, wherein the digital down-converter further comprises a decimator to decimate an output of the multiplier.

16. A signal processing system for receiving and processing one or more signals, comprising:
   a plurality of antennas to receive the signals and generate output signals; and
   a configurable matrix receiver coupled to receive and process the output signals from the antennas, the configurable matrix receiver comprising:
      a plurality of channels, wherein each channel comprises an amplifier having an input, an output and a respective gain, and an analog-to-digital converter (ADC) coupled to the output of the amplifier; and
      a plurality of switches corresponding to the plurality of channels, wherein each switch has a first position coupling an output of one amplifier to an input of another amplifier, and a second position coupling an input of one amplifier to an output of an antenna;
   the system further comprising:
   a digital signal processor (DSP) to receive a plurality of digital signals from the ADCs, and select a one of the digital signals.

17. The system of claim 16, wherein the DSP minimizes quantization error by selecting a digital signal with the highest gain that does not cause saturation of an input of a corresponding one of the ADCs at any point of a single phase encoding level.

18. The system of claim 16, wherein the ADCs have respective overflow flags and the DSP is further configured to select the one of the digital signals responsively to the overflow flags.

19. The system of claim 16, wherein the DSP is configured to select the one of the digital signals responsively to a lookup table correlating maximum expected analog resonance signal levels with corresponding ones of said digital signals to be selected.

20. The system of claim 19, wherein the maximum expected analog resonance signal levels each corresponds to a particular phase encoding level.

21. The system of claim 19, wherein the look-up table is configured to indicate a one of the digital signals for selection which provides a highest gain factor such that amplification of the analog resonance signal does not oversaturate an input of a corresponding one of the ADCs.

22. The system of claim 16, further comprising at least one digital down-converter connected between an ADC and the DSP.

23. The system of claim 22, wherein the digital down-converter comprises a multiplier.

24. A signal processing system for receiving and processing one or more signals, comprising:
   a plurality of antennas to receive the signals and generate output signals; and
   a configurable matrix receiver coupled to receive and process the output signals from the antennas, the configurable matrix receiver comprising:
      a plurality of channels, wherein each channel comprises an amplifier having an input, an output and a respective gain, and an analog-to-digital converter (ADC) coupled to the output of the amplifier; and
      a plurality of switches corresponding to the plurality of channels, wherein each switch has a first position coupling an output of one amplifier to an input of another amplifier, and a second position coupling an input of one amplifier to an output of an antenna;
   the system further comprising:
   a digital signal processor (DSP) configured to receive a plurality of digital signals from the ADCs, and select a one of the digital signals; and
   the DSP being further configured to correct for lack of phase coherence and differing gain in the digital signals respective of each of the channels, whereby the one of the digital signals remains normalized with respect to others of the digital signals when the others are selected.

25. A signal processing system for receiving and processing one or more signals, comprising:
   a plurality of antennas to receive the signals and generate output signals; and
   a configurable matrix receiver coupled to receive and process the output signals from the antennas, the configurable matrix receiver comprising:
      a plurality of channels, wherein each channel comprises an amplifier having an input, an output and a respective gain, an analog-to-digital converter (ADC) coupled to the output of the amplifier, and a digital down-converter that comprises a multiplier and a decimator; and
      a plurality of switches corresponding to the plurality of channels, wherein each switch has a first position coupling an output of one amplifier to an input of another amplifier, and a second position coupling an input of one amplifier to an output of an antenna;
   the system further comprising:
   a digital signal processor (DSP) to receive a plurality of digital signals from the digital down-converters, and select a one of the digital signals.

26. A signal processing system for receiving and processing one or more signals, comprising:
   an antenna to detect an input signal and generate an output signal; and
   a configurable matrix receiver to process the output signal, comprising:
      a first amplifier having a first input and a first output, wherein the first input of the first amplifier is selectively coupled to the antenna;
      a second amplifier having a second input and a second output;
      a switch that selectively moves between a first position that couples the first output of the first amplifier to the second input of the second amplifier, and a second position that decouples the first output of the first amplifier from the second input of the second amplifier;
      a first analog-to-digital converter (ADC) coupled to the first output of the first amplifier; and
      a second ADC coupled to the second output of the second amplifier.

27. The system of claim 26, further comprising an additional antenna coupled to the second input of the second amplifier.

28. A magnetic resonance imaging system, comprising:
   at least one magnetic field generator positioned to create a field through an imaging volume configured to receive at least a portion of a sample to be imaged;
   at least one transmitting antenna positioned to apply a radio frequency signal to at least a portion of the sample within the imaging volume;
   at least one receiving antenna to detect magnetic resonance signals from the sample within the imaging volume, and generate output signals;
   a configurable matrix receiver coupled to receive and process the output signals from the at least one receiving antenna, the configurable matrix receiver comprising:
      a plurality of channels, wherein each channel comprises an amplifier having an input, an output and a respective gain, and an analog-to-digital converter (ADC) coupled to the output of the amplifier; and
      a plurality of switches corresponding to the plurality of channels, wherein each switch has a first position coupling an output of one amplifier to an input of another amplifier, and a second position coupling an input of one amplifier to an output of a receiving antenna;
   the system further comprising:
   a digital signal processor (DSP) to receive a plurality of digital signals from the ADCs, and select a one of the digital signals.

29. The system of claim 28, wherein at least one of the at least one transmitting antennas and at least one of the at least one receiving antennas are the same.

30. The system of claim 28, wherein the DSP receives the digital signals, selects a one of the digital signals having a lowest distortion, and corrects for lack of phase coherence and differing gain in the digital signals, whereby the selected digital signal remains normalized with respect to others of the digital signals when the others are selected.

31. The system of claim 28, wherein the DSP minimizes quantization error by selecting a digital signal with the highest gain that does not cause saturation of an input of a corresponding one of the ADCs at any point of a single phase encoding level.

32. The system of claim 28, wherein the ADCs have respective overflow flags and the DSP is further configured to select the one of the digital signals responsively to the overflow flags.

33. The system of claim 28, wherein the DSP is configured to select the one of the digital signals responsively to a lookup table correlating maximum expected analog resonance signal levels with corresponding ones of said digital signals to be selected.

34. The system of claim 28, further comprising at least one digital down-converter connected between an ADC and the DSP.

35. The system of claim 34, wherein the digital down-converter comprises a multiplier.

36. The system of claim 35, wherein the digital down-converter further comprises a decimator to decimate an output of the multiplier.

37. A magnetic resonance imaging system, comprising:
at least one magnetic field generator positioned to create a field through an imaging volume configured to receive at least a portion of a sample to be imaged; and
a configurable matrix to process one or more magnetic resonance signals received from the sample, comprising:
a first amplifier having a first input and a first output;
a second amplifier having a second input and a second output;
a switch having a first position coupling the first output of the first amplifier to the second input of the second amplifier, and a second position decoupling the first output of the first amplifier from the second input of the second amplifier;
a first analog-to-digital converter (ADC) coupled to the first output of the first amplifier; and
a second ADC coupled to the second output of the second amplifier.

38. The system of claim 37, further comprising at least one receiving antenna to detect the magnetic resonance signals from the sample, coupled to the first input of the first amplifier.

39. The system of claim 38, further comprising at least one transmitting antenna positioned to apply a radio frequency signal to at least a portion of the sample within the imaging volume.

40. The system of claim 38, further comprising an additional receiving antenna coupled to the switch, wherein the switch is in the second position.

* * * * *